(12) United States Patent
Han

(10) Patent No.: US 11,477,879 B2
(45) Date of Patent: Oct. 18, 2022

(54) ELECTRONIC COMPONENT MODULE AND ELECTRONIC DEVICE INCLUDING THE SAME

(71) Applicant: Samsung Electro-Mechanics Co., Ltd., Suwon-si (KR)

(72) Inventor: Kyung Ho Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 134 days.

(21) Appl. No.: 16/749,111

(22) Filed: Jan. 22, 2020

(65) Prior Publication Data
US 2021/0051797 A1 Feb. 18, 2021

(30) Foreign Application Priority Data

Aug. 14, 2019 (KR) .................. 10-2019-0099771

(51) Int. Cl.
*H05K 1/11* (2006.01)
*H05K 1/02* (2006.01)
*H05K 1/14* (2006.01)

(52) U.S. Cl.
CPC .......... *H05K 1/0224* (2013.01); *H05K 1/028* (2013.01); *H05K 1/118* (2013.01); *H05K 1/147* (2013.01);
(Continued)

(58) Field of Classification Search
CPC ............... H05K 1/0224; H05K 1/118; H05K 2201/0723; H05K 2201/09972; H05K 3/284; H05K 1/0216; H05K 3/4691; H05K 9/0015; H05K 9/006; H05K 1/148; H05K 1/147; H05K 1/0278; H05K 1/028; H01Q 1/22; H01L 23/552; H01L 23/525;
(Continued)

(56) References Cited

U.S. PATENT DOCUMENTS 7,265,719 B1 * 9/2007 Moosbrugger ...... H01Q 21/065
343/893
9,633,977 B1 * 4/2017 We ...................... H01L 23/5387
(Continued)

FOREIGN PATENT DOCUMENTS

KR 10-2005-0092050 A 9/2005
KR 10-2011-0135294 A 12/2011
(Continued)

OTHER PUBLICATIONS

Korean Office Action dated Nov. 24, 2020 in counterpart Korean Patent Application No. 10-2019-0099771. (7 pages in English) (6 pages in Korean).

*Primary Examiner* — Steven T Sawyer
(74) *Attorney, Agent, or Firm* — NSIP Law

(57) ABSTRACT

An electronic component module includes a first module including a sealing portion disposed on a first surface of a first board and a shielding layer disposed on a surface of the sealing portion, a second module spaced apart from the first module, a connection board having greater flexibility than the first board and connecting the first module to the second module, and a first ground line electrically connected to a ground layer of the first board and disposed on a surface of the connection board, and at least a portion of the shielding layer is electrically connected to the ground layer of the first board.

19 Claims, 14 Drawing Sheets

(52) U.S. Cl.
CPC ..... *H05K 1/148* (2013.01); *H05K 2201/0723* (2013.01)

(58) Field of Classification Search
CPC ..... H01L 23/32; H01L 23/31; H01L 23/5387; H01L 23/66
See application file for complete search history.

(56) References Cited

U.S. PATENT DOCUMENTS

| | | | |
|---|---|---|---|
| 9,818,722 B1 * | 11/2017 | Wang | H01L 23/5389 |
| 2011/0304015 A1 | 12/2011 | Kim et al. | |
| 2017/0294469 A1 * | 10/2017 | Lee | H01L 24/20 |
| 2018/0077829 A1 * | 3/2018 | Yamamoto | B32B 15/08 |
| 2018/0286816 A1 * | 10/2018 | Kitazaki | H01L 23/02 |
| 2019/0036229 A1 | 1/2019 | Kim et al. | |
| 2019/0081380 A1 * | 3/2019 | Bates | H01L 25/0655 |
| 2019/0103653 A1 * | 4/2019 | Jeong | H01L 25/0655 |
| 2020/0176394 A1 * | 6/2020 | Liu | H01L 21/4853 |
| 2020/0312798 A1 * | 10/2020 | Kawahata | G01S 7/03 |

FOREIGN PATENT DOCUMENTS

| | | |
|---|---|---|
| KR | 10-2017-0116461 A | 10/2017 |
| KR | 10-2017-0122021 A | 11/2017 |
| KR | 10-2018-0048347 A | 5/2018 |
| KR | 10-2019-0013382 A | 2/2019 |
| KR | 10-2019-0040789 A | 4/2019 |
| WO | WO 2004/066194 A1 | 8/2004 |

\* cited by examiner

ELECTRONIC COMPONENT MODULE AND ELECTRONIC DEVICE INCLUDING THE SAME

CROSS-REFERENCE TO RELATED APPLICATION(S)

This application claims the benefit under 35 USC 119(a) of Korean Patent Application No. 10-2019-0099771 filed on Aug. 14, 2019, in the Korean Intellectual Property Office, the entire disclosure of which is incorporated herein by reference for all purposes.

BACKGROUND

1. Field

The following description relates to an electronic component module and an electronic device including the same.

2. Description of Background

There has been rapidly increasing demand for portable devices in the electronic products market, and miniaturization and weight reduction of electronic devices mounted on the portable devices thereof are becoming required.

To manufacture miniaturized and lightweight electronic devices, there has been demand not only for technology for reducing the sizes of individual components mounted thereon but also for System-on-Chip (SoC) technology for providing a plurality of individual devices in one chip or System-in-Package (SiP) technology for providing numerous individual devices in a single package.

In particular, it is necessary that a shape and a structure of an electronic component module equipped in a mobile device be appropriately modified when the mobile device is thin and has an extremely confined interior mounting space.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An electronic component module mountable in a confined mounting space and an electronic device including the same.

In one general aspect, an electronic component module includes a first module including a sealing portion disposed on a first surface of a first board and a shielding layer disposed on a surface of the sealing portion, a second module spaced apart from the first module, a connection board having greater flexibility than the first board and connecting the first module to the second module. A first ground line electrically connected to a ground layer of the first board is disposed on a surface of the connection board, and at least a portion of the shielding layer is electrically connected to the ground layer of the first board.

The first module may include a plurality of electronic components mounted on the first board, and the plurality of the electronic components may include a first element disposed outside of the sealing portion and a second element embedded in the sealing portion.

The second module may include at least one antenna electrically connected to the second element.

The first module may include a second ground line exposed to a side surface of the first board, and the shielding layer may be extended toward the side surface of the first board and connected to the second ground line.

The ground layer of the first board may be disposed in a region of the first board opposing the sealing portion.

The first ground line may extend inside the first board.

The connection board may be a flexible printed circuit board (PCB).

The first board may include an insulating layer and a wiring layer repeatedly laminated on at least one surface of the connection board.

The electronic component module may include a shielding wall disposed along a side surface of the sealing portion, and the shielding layer may be disposed along the shielding wall and the sealing portion.

The electronic component may include an antenna disposed on a second surface of the first board or disposed inside the first board and adjacent to the second surface of the first board.

In another general aspect, an electronic component module includes a first module including a sealing portion disposed on a first surface of a first board and a shielding layer disposed along a surface of the sealing portion, a second module spaced apart from the first module, and a connection board having greater flexibility than the first board and connecting the first module to the second module. A first side surface of the sealing portion adjacent to the connection board has roughness different from a roughness of a second side surface opposite the first side surface.

A deviation of a surface height of the first side surface may be 5 μm or less, and a deviation of a surface height of the second side surface may be 1 μm or less.

The electronic component may include a first ground line electrically connected to a ground layer of the first board and disposed on a surface of the connection board, and at least a portion of the shielding layer may be electrically connected to the ground layer of the first board.

The first module and the second module may each include an antenna electrically connected to an electronic component mounted on the first board.

The electronic component module may include a shielding wall disposed along the first side surface and the second side surface of the sealing portion, and the shielding wall may be thinner at a first end adjacent to the first board than at a second end opposite the first end.

In another general aspect, an electronic device includes an electronic component module including a first module having a first antenna, a second module having a second antenna, and a connection board formed of a flexible printed circuit board (PCB) to connect the first module to the second module, and a case accommodating the electronic component module therein. The first antenna and the second antenna are disposed such that a first radiation direction of the first antenna is different from a second radiation direction of the second antenna.

The first direction may be perpendicular to the second direction.

The first module may include a first board having greater rigidity than the connection board, a sealing portion disposed on a first surface of a first board, a shielding layer disposed on a surface of the sealing portion, and at least one electronic component embedded in the sealing portion, and the first antenna may be disposed on a second surface of the first board opposite the first surface.

The first module may include a ground line having a first portion disposed inside the first board and a second portion that extends outside of the first board along a surface of the connection board, and the shielding layer may be electrically connected to the second portion of the ground line.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
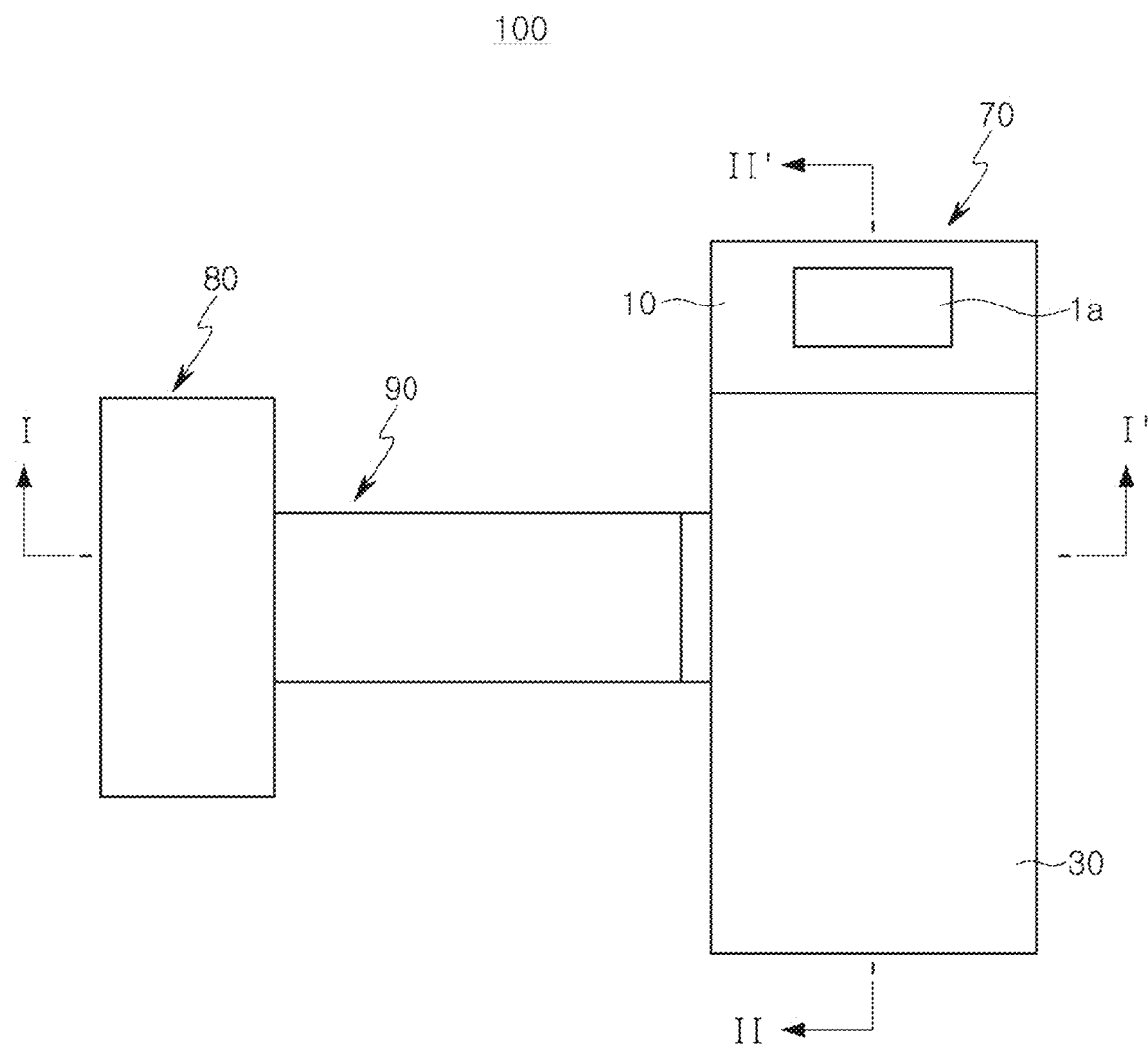
FIG. 1 is a planar view of an electronic component module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in further detail with reference to the accompanying drawings.

Figure 2:
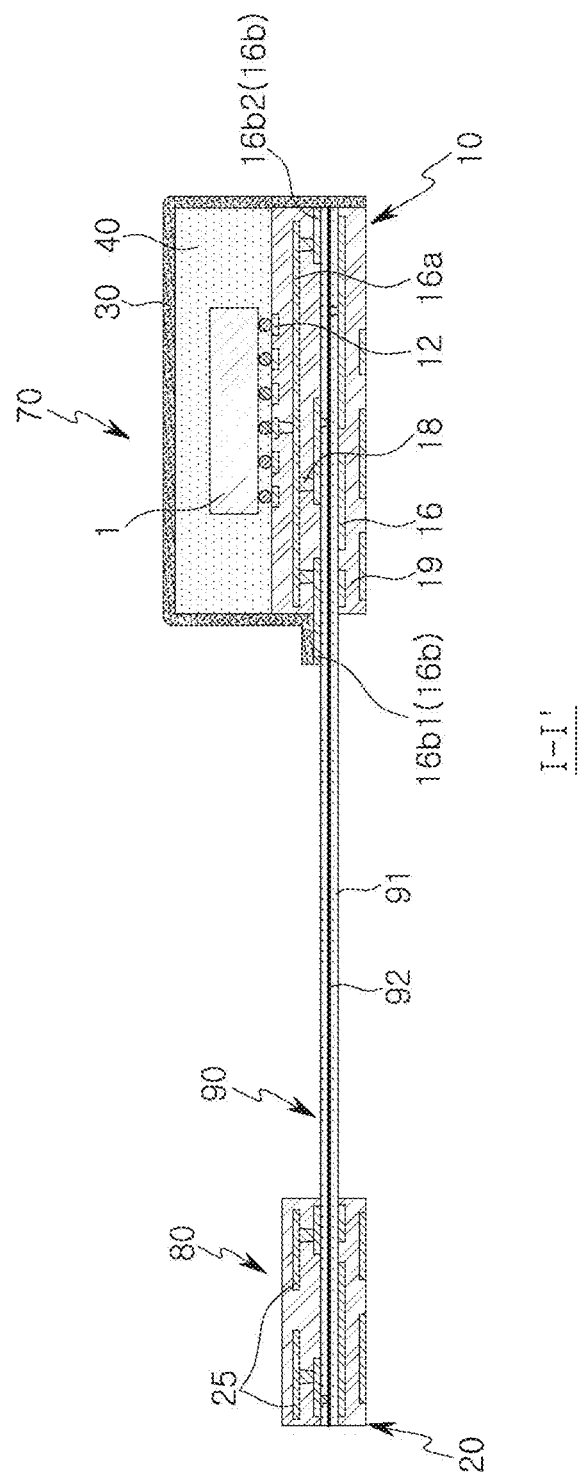
FIG. 2 is a cross-sectional view taken along line I-I' of FIG. 1.
Figure 3:
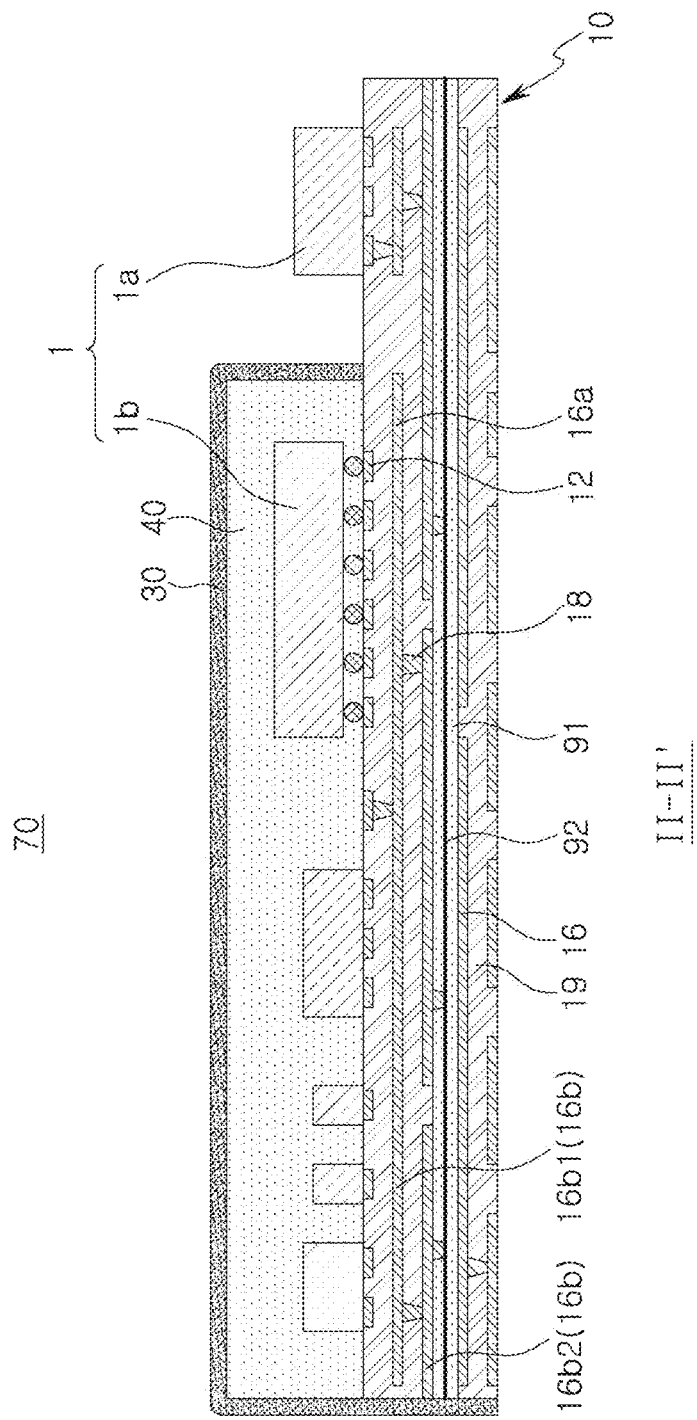
FIG. 3 is a cross-sectional view taken along line II-II' of FIG. 1.

FIG. 1 is a planar view of an electronic component module according to an example, and FIG. 2 is a cross-sectional view taken along line I-I' of FIG. 1, while FIG. 3 is a cross-sectional view taken along line II-II' of FIG. 1.

Referring to FIGS. 1, 2, and 3, an electronic component module 100 may include a first module 70, a second module 80 and a connection board 90.

The first module 70 may include a first board 10, an electronic component 1, a sealing portion 40 and a shielding layer 30.

The first board 10 may be a multilayer board formed of a plurality of insulating layers 19 and a plurality of wiring layers 16, which are repeatedly laminated on each other. If necessary, however, the first board 10 may be a double-sided board on which wiring layers 16 are formed on both sides of a single insulating layer 19.

A material of the insulating layer 19 is not particularly limited, but may be, for example, a thermosetting resin such as an epoxy resin, a thermoplastic resin such as polyimide, or a resin in which the thermosetting or thermoplastic resin is impregnated with an inorganic filler in a core material such as a glass fiber (or a glass cloth or a glass fabric), or the like, for example, an insulating material such as prepreg, Ajinomoto Build-up Film (ABF), FR-4, and Bismaleimide Triazine (BT).

The wiring layer 16 may be electrically connected to the electronic device 1, which will be described later, and may be connected to the shielding layer 30.

As a material of the wiring layer 16, a conductive material such as copper (Cu), aluminum (Al), silver (Ag), tin (Sn), gold (Au), nickel (Ni), lead (Pb), titanium (Ti), alloys thereof, or the like may be used.

Interlayer-connecting conductors 18 are disposed inside the insulating layer 19 for the interconnection of the laminatedly disposed wiring layers 16.

Although not illustrated in the drawings, an insulation-protecting layer may be disposed on a surface of the first board 10. The insulation-protecting layer may be formed of solder resist and disposed to entirely cover the insulating layer 19 and the wiring layer 16 on top and bottom surfaces of the insulating layer 19. In this regard, the insulation-protecting layer protects the wiring layer 16 disposed on the top or bottom surface of the insulating layer 19.

The first board 10 includes a first surface and a second surface that is opposite to the first surface. The first surface refers to a mounting surface on which the electronic device 1 is mounted, and the second surface refers to a surface opposing a motherboard when mounting the electronic component module 100 on the motherboard. Accordingly, mounting electrodes 12 for mounting the electronic component 1 and a wiring pattern connecting the mounting electrodes 12 may be formed on the first surface of the first board 10.

In an example, the wiring layer 16 of the first board 10 includes a ground layer 16a and a ground line 16b. The ground layer 16a and the ground line 16b are disposed inside the first board 10 and may be electrically connected to each other.

The ground layer 16a may be entirely disposed in a region facing the sealing portion 40. In this regard, electromagnetic waves flowing into the electronic device 1 from a lower portion of the first board 10 or flowing out in a direction opposite thereto may be blocked by the ground layer 16a.

At least a portion of the ground line 16b is exposed to an exterior of the first board 10, and the shielding layer 30, which will be described later, is bonded to a portion of the ground line 16b that is exposed to an exterior of the first board 10.

In an example, the ground line 16b may include a first ground line 16b1 disposed along a surface of the connection board 90, which will be described later, and a second ground line 16b2 exposed to a side surface of the first board 10.

The first ground line 16b1 is disposed in a form in which a wiring layer 16 disposed inside the first board 10 is extended toward the connection board 90. Accordingly, a portion of the first ground line 16b1 is positioned inside the first board 10 and the remaining portion is positioned on one surface of the connection board 90.

The first board 10 is a circuit board having rigidity and may be a printed circuit board (PCB), a ceramic board, a pre-molded board, a direct bonded copper (DBC) board or an insulated metal substrate (IMS), but is not limited thereto.

The connection board 90 may be partially inserted into the first board 10.

In an example, the connection board 90 is formed of a thin film circuit board (for example, a flexible PCB) having a wiring pattern formed inside. Accordingly, the connection board 90 may include an insulating layer 91 and a wiring layer 92. The insulating layer 91 and the wiring layer 92 of the connection board 90 may have materials and thicknesses different from the insulating layer 19 and the wiring layer 16 of the first board 10, but a configuration of the insulating layer 91 and the wiring layer 92 is not limited thereto.

The connection board 90 electrically connects the first module 70 to the second module 80. In this regard, the first board 10 is connected to an end of the connection board 90 and a second board 20 of the second module 80 is connected to the other end of the connection board 90.

The first board 10 and the second board 20 may be formed by repeatedly laminating the insulating layers 19 and the wiring layers 16 on at least one surface of the connection board 90.

In an example, the first board 10 and the second board 20 are integrally formed together with the connection board 90 to be a single body by laminating the insulating layers 19 and the wiring layers 16 on both surfaces of the connection board 90. Accordingly, the first and second boards 10 and 20 and the connection board 90 may be manufactured in an integral body during manufacturing thereof.

Although not limited, the first and second boards 10 and 20 and the connection board 90 may be separately manufactured and then integrated through adhesion, compression, or the like, and various modifications are feasible.

The electronic component 1 may include various electronic components such as passive components and active components. In other words, any electronic components mounted on the first board 10 or any component which can be built inside the first board 10 can be used. Further, in an example, the electronic component 1 is not limited to components, but may include various elements, such as a connector, which are mounted on the first board 10 or electrically connect components.

In an example, the electronic component 1 includes at least one first element 1a disposed outside of the sealing portion 40, which will be described later, and at least one second element 1b embedded inside the sealing portion 40. For example, the first element 1a may be a connector and the second element 1b may be a passive component or an active component, but are not limited thereto.

The sealing portion 40 is disposed on the first surface of the board 10 and seals the second element 1b. The sealing portion 40 fixes the second element 1b while enclosing the second element 1b, to safely protect the second element 1b from an external impact. As previously described, however, the first element 1a of the electronic component 1 is not embedded in the sealing portion 40 and is disposed outside the sealing portion 40.

The sealing portion 40 is formed of an insulating material. For example, the sealing portion 40 may be formed of a resin material such as an epoxy molding compound (EMC), but is not limited thereto. If necessary, a material having conductivity (e.g., a conductive resin, or the like) may be used to form the sealing portion 40. In this case, an insulating sealing member, such as an underfill, may be provided between the second component 1*b* and the first board 10.

The shielding layer 30 may be prepared by applying a resin material containing conductive powder to an outer surface of the sealing portion 40 or forming a metal thin film. For example, the shielding layer 30 may be a metal thin film formed through a spray coating method, but is not limited thereto. To form a metal thin film, various techniques including sputtering, screen-printing, vapor deposition, electroplating and electroless plating may be used.

The second module 80 includes the second board 20 and at least one antenna 25 electrically connected to the second element 1*b*.

The second board 20 may be configured similarly to the previously described first board 10. Accordingly, a detailed description of the second board 20 will be omitted.

The antenna 25 provided in the second module 80 is a dipole antenna and is disposed inside the second board 20, but is not limited thereto. A patch antenna may be provided as the antenna 25. Alternatively, the antenna 25 may be disposed on a surface of the second board 20 or prepared as a separate mounting element such as a chip antenna to be mounted on any one surface of the second board 20, and various modifications are feasible.

A position in which the antenna 25 is disposed may vary according to a form of the second module 80 being built inside an electronic device.

For example, FIG. 2 exemplifies a case in which the antenna 25 is disposed closely to a first surface of the second board 20. If necessary, however, the antenna 25 may be disposed in a position on the second surface of the second board 20 or close to the second surface.

In addition, the second module 80 is not limited to being provided only with the antenna 25, and may include various electronic elements, if necessary, such as an electronic component or a connector.

The electronic component module 100 having such configuration can not only protect the electronic component 1 mounted on the first board 10 from an external environment through the sealing portion 40 or the shielding layer 30 but also easily shield electromagnetic waves.

In addition, as the shielding layer 30 is connected to the first ground line 16*b*1 disposed on a surface of the connection board 90, bonding reliability can be obtained.

When the shielding layer 30 is connected only to a second ground line 16*b*2 exposed toward a side surface of the first board 10 without the first ground line 161*b*, a contact area of the shielding layer 30 and the second ground line 16*b*2 is too small, thereby making it difficult to secure the boding reliability.

Conventionally, a ground electrode is disposed on a top surface of a board followed by connecting a shielding layer to the ground electrode. However, this leads to a problem of increased size and surface area of the board due to the ground electrode.

In an example, however, the first ground line 16*b*1 is disposed on a surface of the connection board 90, but not the first board 10. In this regard, a large contact area can be secured regardless of the size or surface area of the first board 10, and the bonding reliability can thus be increased.

Further, as the first module 70 and the second module 80 are spaced apart by the connection board 90, a size of the first module 70 can be reduced compared to a case in which an antenna is disposed in the first module 70, and the second module 80 can be disposed in a desired position using the connection board 90, thereby increasing freedom of dispositional arrangements. Accordingly, the second module 80 can be easily built in the electronic device even when a mounting space for the electronic component module 100 is confined.

Hereinafter, a method for manufacturing an electronic component module according to an example will be described.

Figure 4A:
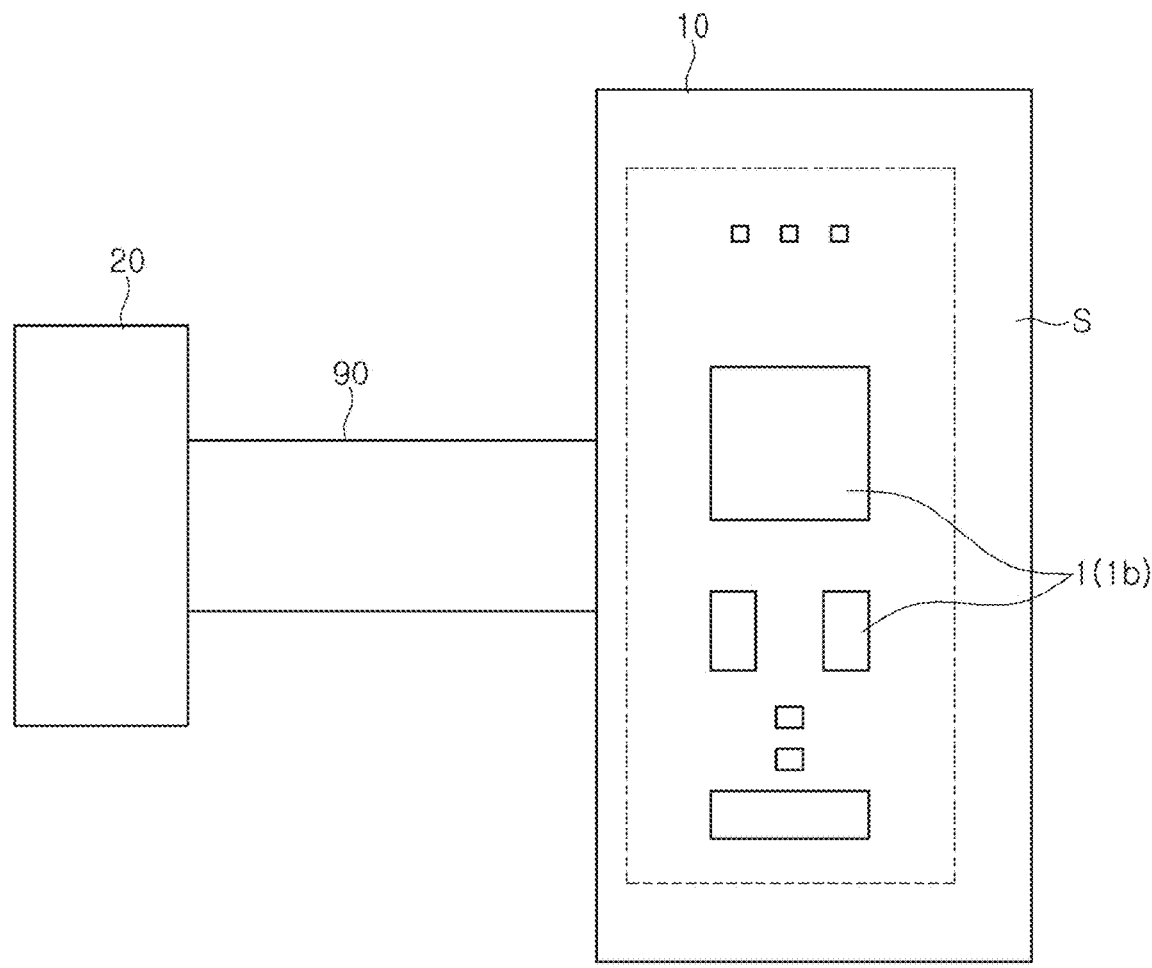
FIGS. 4A, 4B, 5A, 5B, 6A, 6B, 7, and 8 are diagrams illustrating a method for manufacturing the electronic component module illustrated in FIG. 1.
Figure 4B:
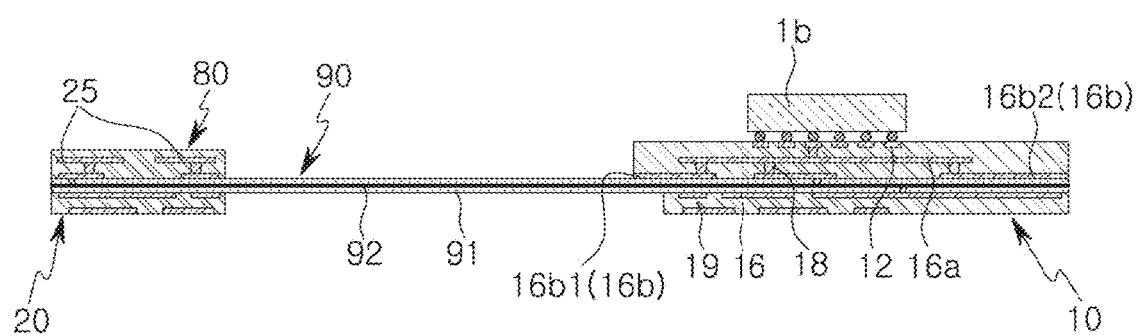
Figure 5A:
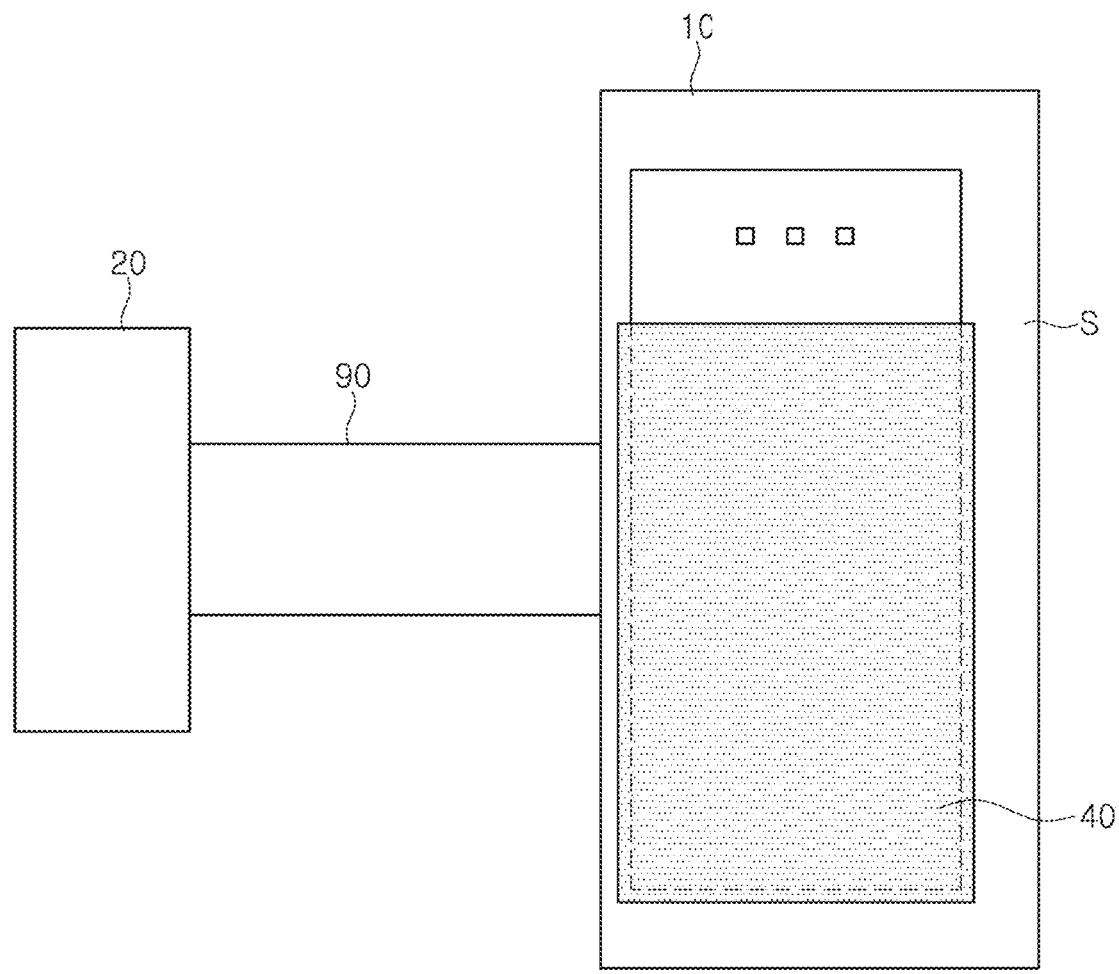
Figure 5B:
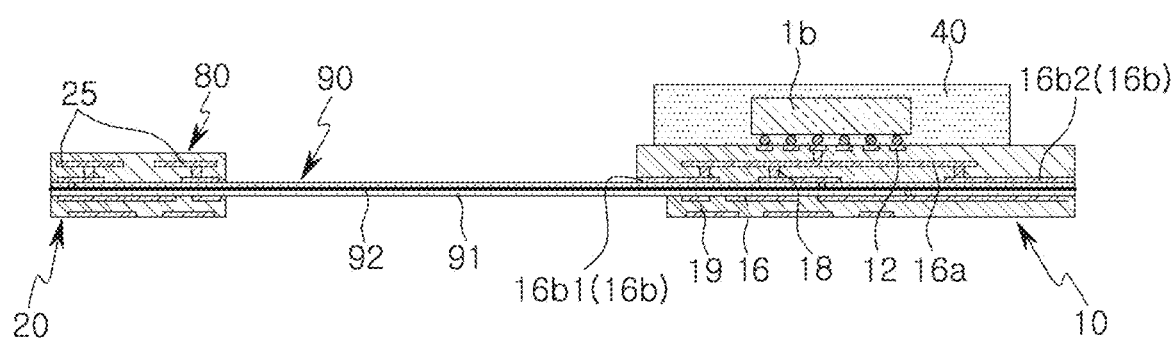
Figure 6A:
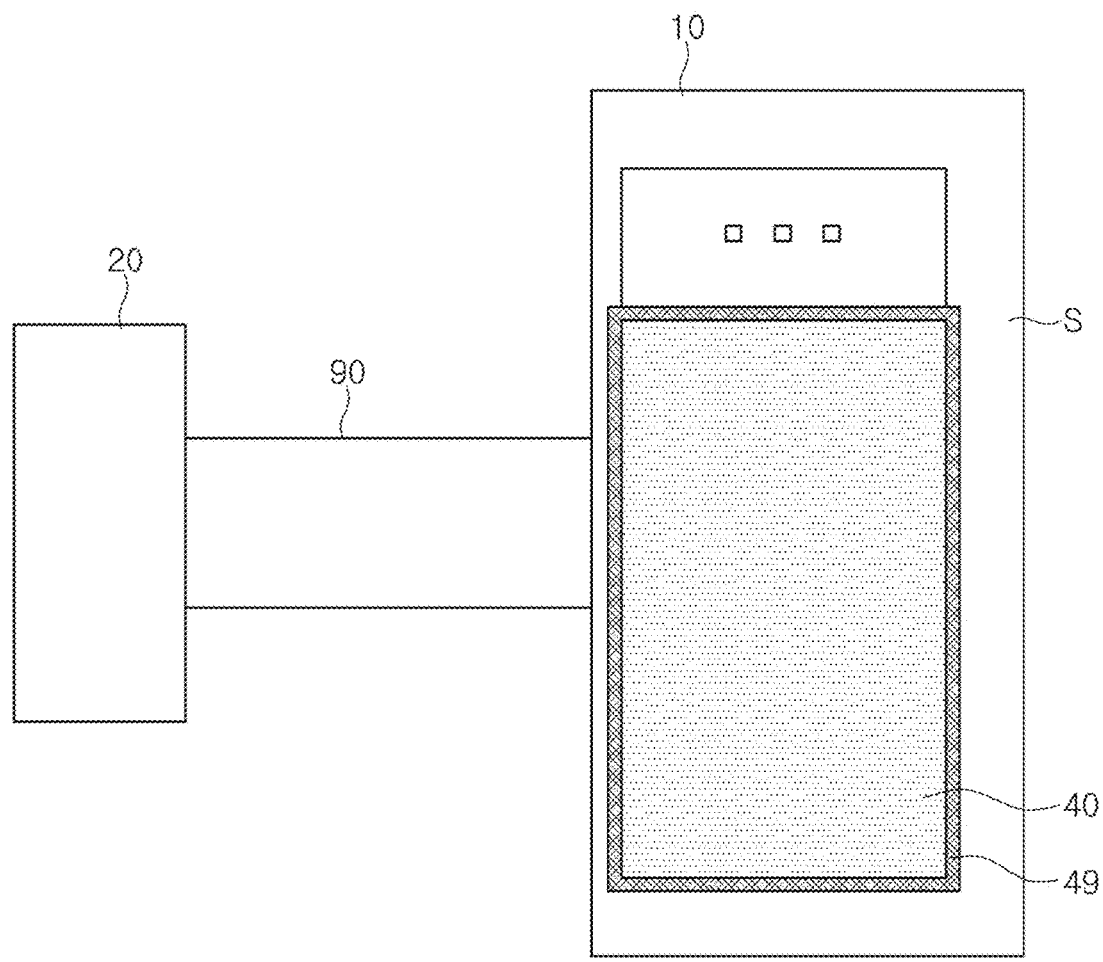
Figure 6B:
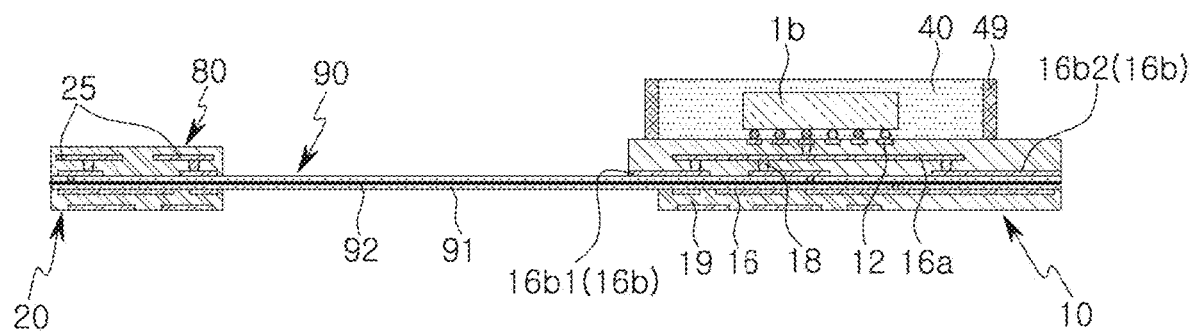

FIGS. 4A through 8 are diagrams illustrating a method for manufacturing the electronic component module illustrated in FIG. 1, where FIGS. 4A, 5A, 6A, 7, and 8 illustrate planes of the electronic component module and FIGS. 4B, 5B, and 6B illustrate cross-sections of the electronic component module.

As illustrated in FIGS. 4A and 4B, the first board 10 and the second board 20 are formed at both ends of the connection board 90, followed by mounting electronic components 1 on the first board 10.

As previously described, the first board 10 and the second board 20 may repeatedly laminate insulating layers 19 and wiring layers 16, respectively, on both surfaces thereof, while having the connection board 90 as a center.

Meanwhile, the first board 10 is formed to have a larger surface area than the first board 10 of a final product (for example, FIG. 1). Specifically, the first board 10 includes a dummy region (S) so that a mold, or the like, can be easily disposed when forming a sealing portion during subsequent manufacture processes. This gives rise to a larger surface area of the first board 10 compared to the final product.

Further, in the final product, a portion of the first ground line 16*b*1, which is exposed to an exterior of the first board 10, is disposed inside the dummy region S of the first board 10 during this process. Accordingly, a greater portion of the first ground line 16*b*1 is not exposed to an exterior of the first board 10.

The electronic components 1 may be connected to the first board 10 through a conductive bond such as a solder. Meanwhile, the electronic component 1 is only mounted with a second element 1*b*.

As illustrated in FIGS. 5A, 5B, 6A, and 6B, the electronic components 1 are sealed to form a sealing portion 40 on the first surface of the first board 10.

The sealing portion 40 is partially formed on the first surface of the first board 10 to embed the second elements 1*b*. Accordingly, a region on which the first element 1*a* is mounted is positioned outside the sealing portion 40.

Such a configuration can be accomplished during molding of forming the sealing portion 40 by disposing a region in which the first element 1*a* is mounted outside a cavity of a mold to prepare a mold.

Such a configuration can also be accomplished by forming the sealing portion 40 on the entire first surface of the first board 10, followed by partially removing the sealing portion 40 covering the first element 1*a*.

During this process, the sealing portion 40 may be manufactured through a transfer molding method, but is not limited thereto. For example, as illustrated in FIGS. 6A and 6B, a dam 49 is formed along a contour of the sealing portion 40, followed by injecting an insulating resin in an interior space of the dam 49 to form the sealing portion 40.

The dam 49 may be formed by applying an insulating material to the first board 10 using a dispenser having a syringe-shape nozzle. In this case, the dam 49 may function as the sealing portion.

Alternatively, a film provided with an internal space may be mounted on the first board 10 to use as a dam. In this case, the film used as a dam is removed once the preparation of the sealing portion 40 is completed.

At least a portion of the sealing portion 40 may be disposed on the dummy region S of the first board 10 during this process. The sealing portion 40 disposed in the dummy region S is removed together with the dummy region S during the cutting process, which will be described later, but is not limited thereto.

Figure 7:
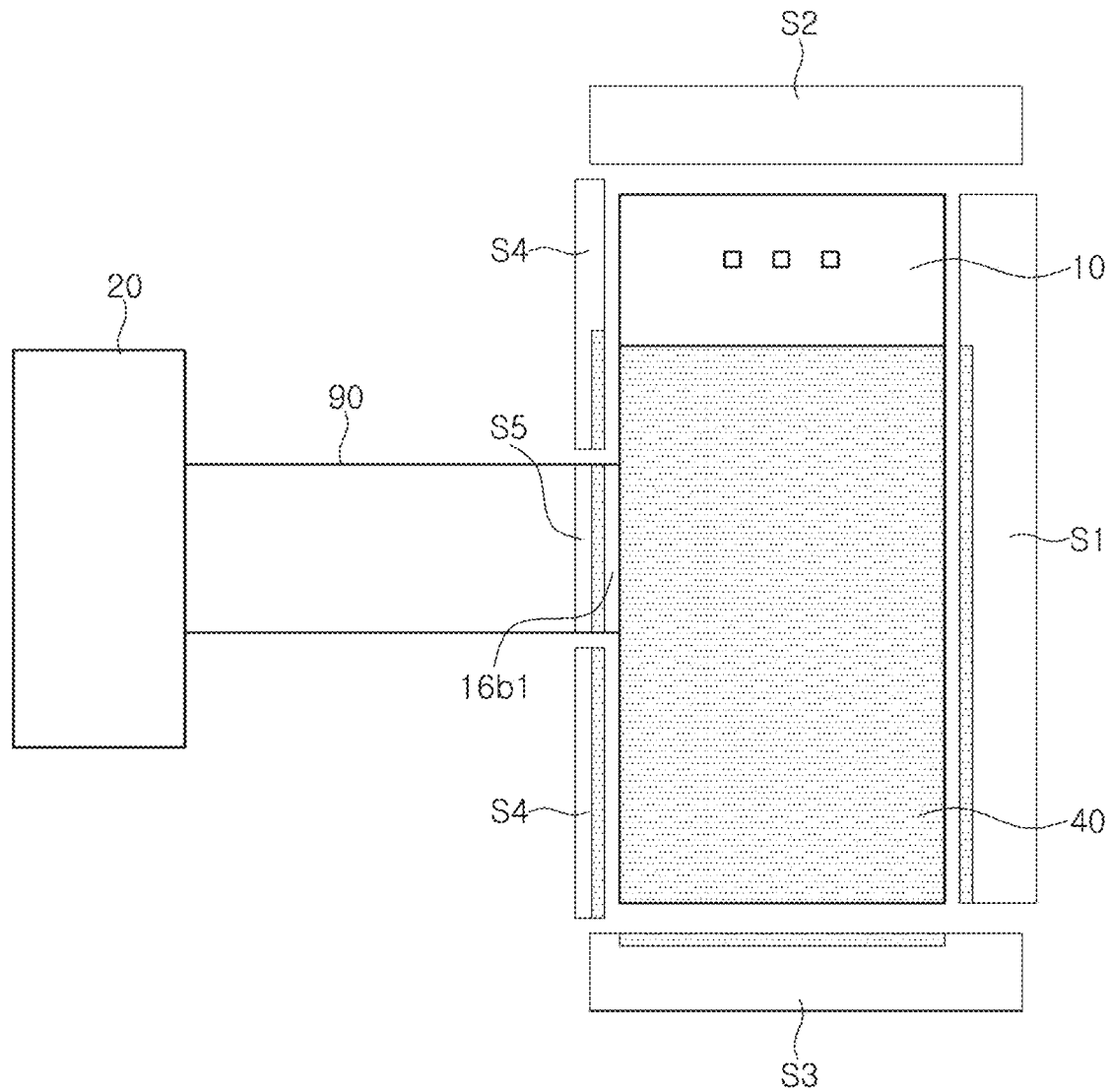

As illustrated in FIG. 7, dummy regions S1, S2, S3, S4 and S5 are removed to form the first module 70.

In FIG. 7, the dummy regions S1, S2, S3, and S4 are prepared for the formation of the sealing portion 40, and thus are removed during this process. Dummy region S5 is partially removed, and the connection board 90 and a portion excluding the wiring layer disposed on a surface of the connection board 90 are removed.

During this process, the sealing portion 40 disposed on the dummy region S is removed, together with the dummy region.

Further, during this process, dummy regions S1, S2, and S3 may be cut using a blade such as a saw blade, and dummy regions S4 and S5 are cut and partially cut using a laser. In this regard, a roughness of a cross-section formed by cutting dummy regions S1, S2, and S3 and that by cutting S4 and S5 may be different. For example, the roughness of the section formed by cutting dummy regions S4 and S5 may be larger than that formed by cutting dummy regions S1, S2, and S3.

Figure 14A:
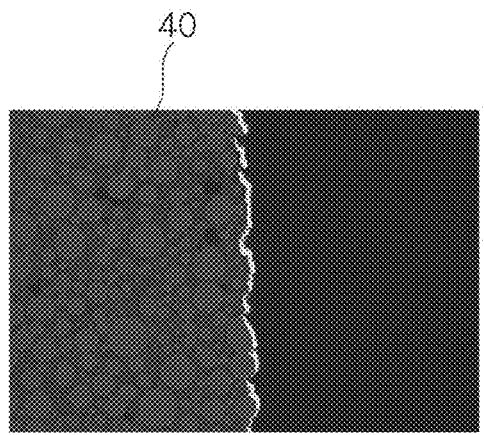
FIG. 14A and FIG. 14B are photographic images of a cross-section of a sealing portion of the electronic component illustrated in FIG. 7.
Figure 14B:
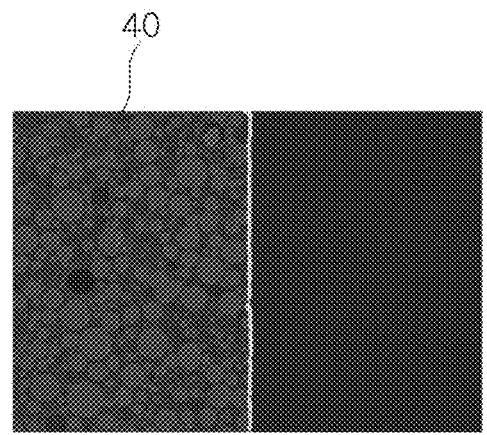

FIG. 14A and FIG. 14B are photo images of a cross-section of a sealing portion of the electronic component illustrated in FIG. 7. FIG. 14A is a photo image of a cross-section of a dummy region cut using a laser and FIG. 14B is a photographic image of a cross-section of a dummy region cut using a blade.

It can be shown based on FIG. 14 that a roughness of the cross-section of the sealing portion 40 formed by a laser illustrated in FIG. 14A is larger than that formed by a blade illustrated in FIG. 14B.

In an example, a height deviation of a surface of the cross-section cut by a laser (FIG. 14A) is formed to be 5 μm or less, whereas that cut by a blade (FIG. 14B) is formed to be 1 μm or less. Accordingly, the roughness of the cross-section formed by cutting dummy regions S1, S2, and S3 is smaller than that formed by cutting dummy regions S4 and S5.

The wiring layer that remains on the surface of the connection board 90 functions as the first ground line 16b1. A width of the first ground line 16b1 disposed outside of the first board 10 may be approximately 1 mm, but is not limited thereto.

Figure 8:
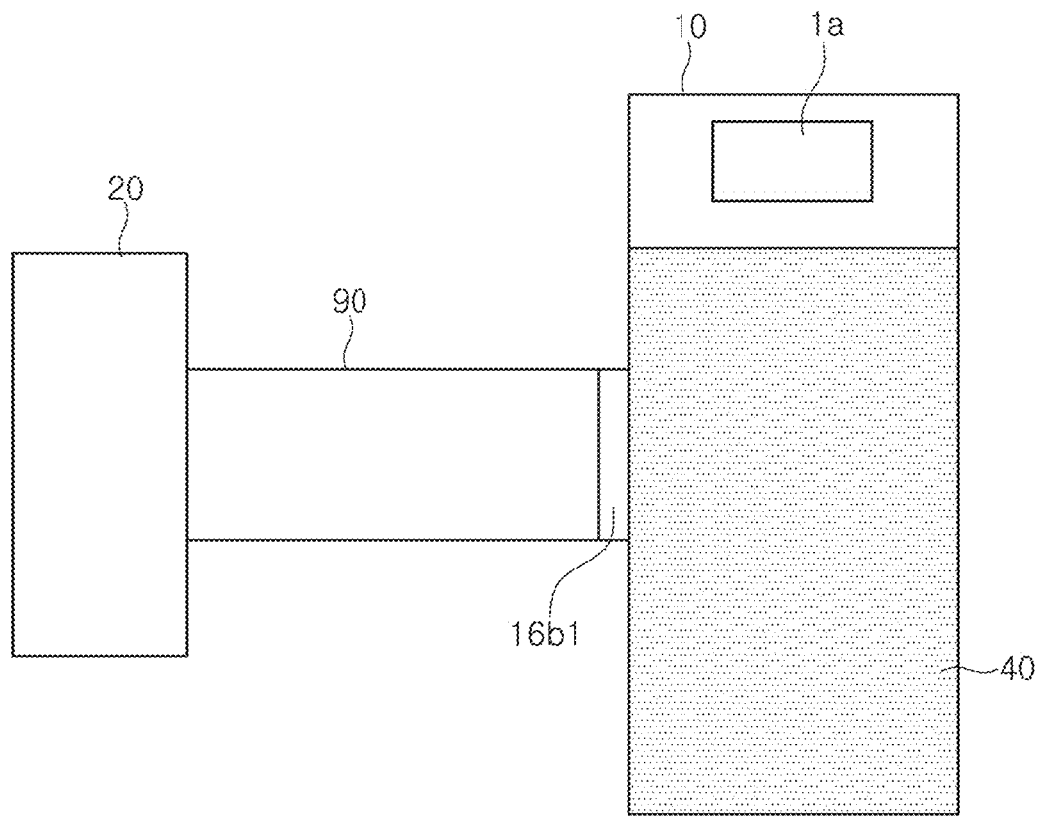

As illustrated in FIG. 8, the first element 1a is mounted on the first board 10. This may be carried out in a similar manner as the process of mounting the second element 1b on the first board 10.

When the sealing portion 40 is formed on the entirety of the first surface of the first board 10, partial removal of the sealing portion 40 covering a region on which the first element 1a is to be mounted may be performed before the first element 1a is mounted on the first board 10.

The sealing portion 40 and the shielding layer 30 is formed along a surface of the first ground line 16b1 to form the electronic component module 100 illustrated in FIG. 1.

As previously described, the shielding layer 30 in an example is formed by applying a conductive material to a surface of the sealing portion 40 using a spray coating method.

During the shielding layer 30 application, the shielding layer 30 extends toward the surface of the first board 10 to be applied also to surfaces of the first and second ground lines 16b1 and 16b2 exposed to an exterior of the first board 10. In this regard, the shielding layer 30 is electrically connected to the wiring layer 16 of the first board 10 via the first and second ground lines 16b1 and 16b2.

A method for forming the shielding layer 30 is not limited to the description. Various methods such as sputtering, spray coating, screen-printing, vapor deposition, electroplating and electroless plating may be used to form the shielding layer 30.

The electronic component module is not limited to the previously described examples and is subject to various applications.

Figure 9:
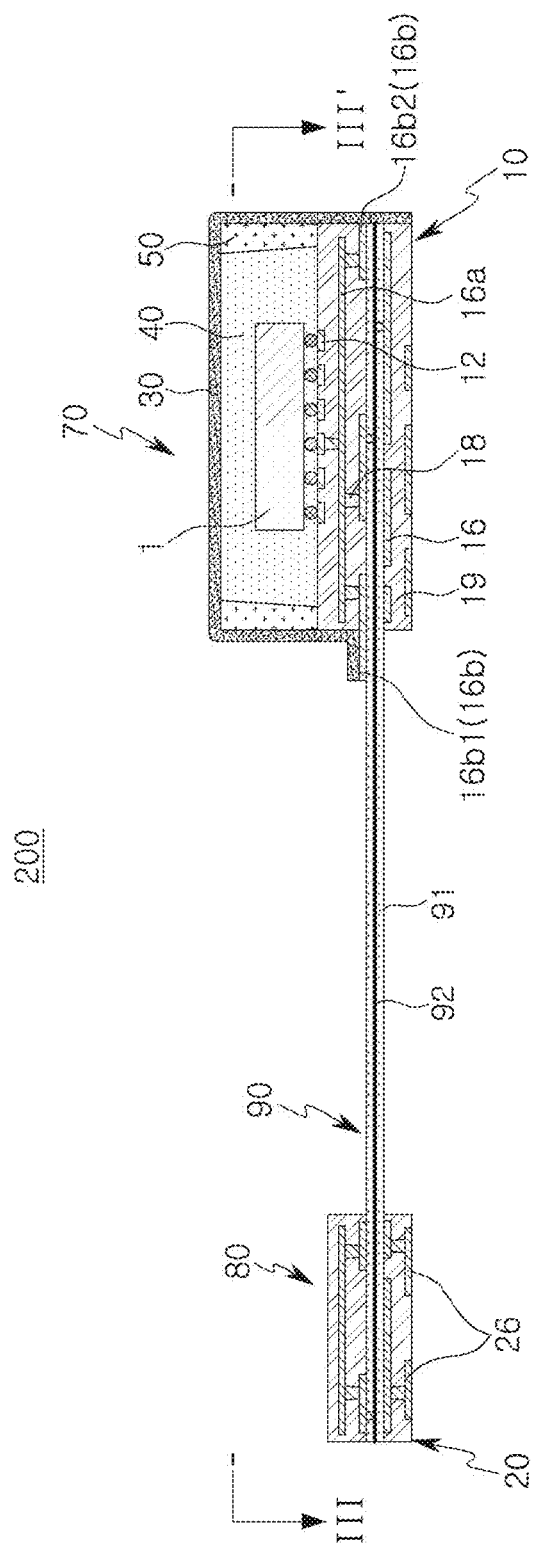
FIG. 9 is a cross-sectional view schematically illustrating an electronic component module according to an example.
Figure 10:
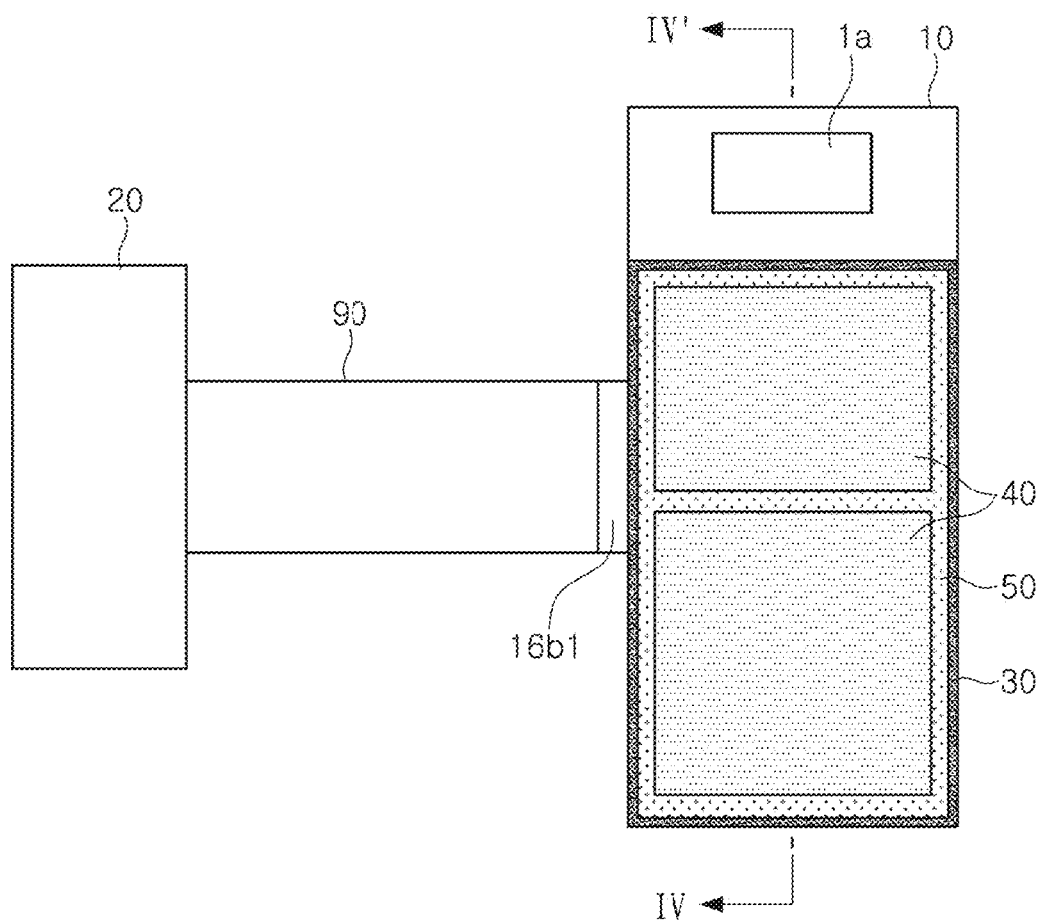
FIG. 10 is a cross-sectional view taken along line III-III' of FIG. 9.
Figure 11:
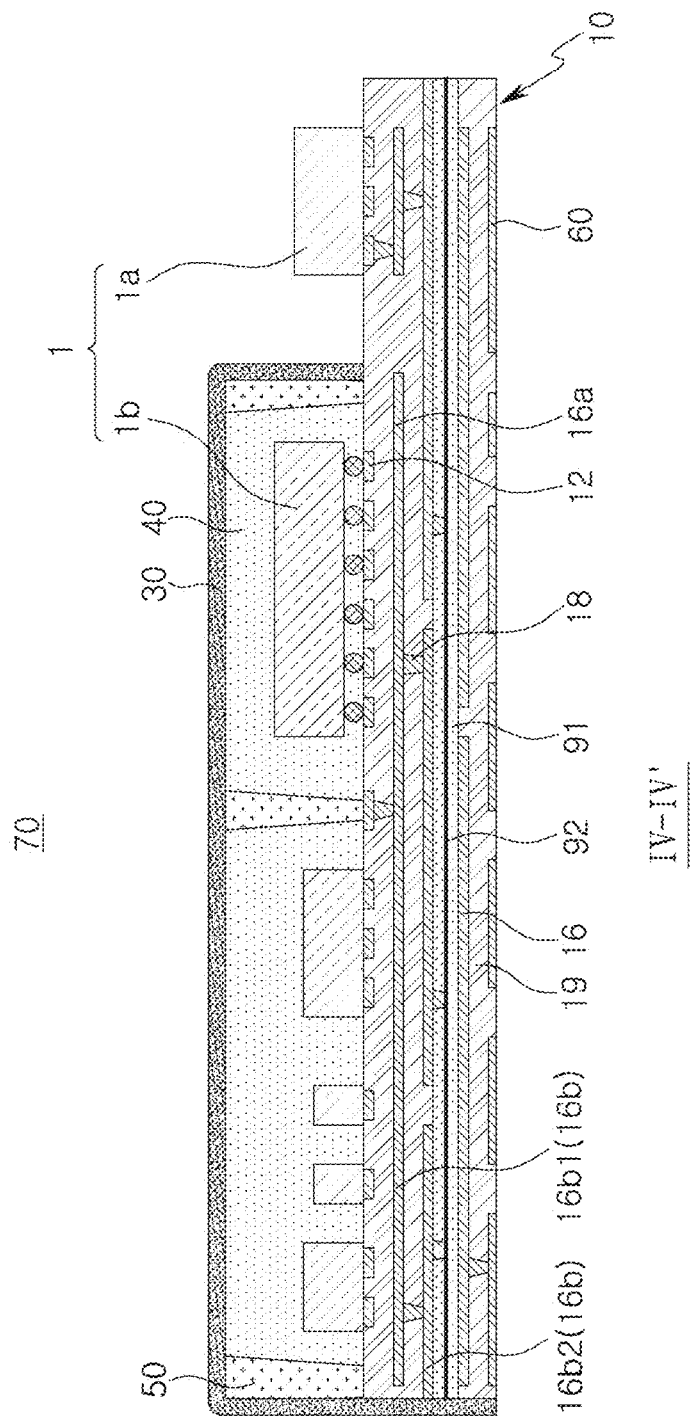
FIG. 11 is a cross-sectional view taken along line IV-IV' of FIG. 10.

FIG. 9 is a cross-sectional view schematically illustrating an electronic component module according to an example and FIG. 10 is a cross-sectional view taken along line III-III' of FIG. 9, while FIG. 11 is a cross-sectional view taken along line IV-IV' of FIG. 10.

Referring to FIGS. 9, 10, and 11, an electronic component module 200 according to an example is configured similarly to the electronic component illustrated in FIG. 1 and is different from the electronic component illustrated in FIG. 1 in that the electronic component module 200 further includes a shielding wall 50.

The shielding wall 50 is disposed along a side surface of the sealing portion 40, and a shielding layer 30 is disposed along a surface formed by the sealing portion 40 and the shielding wall 50.

Such a configuration can be accomplished by forming the sealing portion 40 followed by forming a trench along the side surface of the sealing portion 40, filling a conductive material inside the trench and removing the sealing portion disposed in an external side of the shielding wall in order.

The trench is formed along the side surface of the sealing portion 40 while being spaced apart from the side surface by a pre-determined distance, and may be formed in the shape of vertically passing through the sealing portion 40 to expose the first board 10.

In an example, the shielding layer 30 is formed by a spray coating method. In this regard, a thickness of the shielding layer 30 formed on a side surface of the shielding wall 50 is relatively smaller than a thickness of the shielding layer 30 formed on a top surface of the sealing portion 40. Accordingly, when an electronic component module only includes a shielding layer and not a shielding wall 50, shielding reliability may be reduced due to the thin shielding layer 30.

Accordingly, the electronic component module 200 according to an example has a double shielding structure consisting of a shielding layer 30 and a shielding wall 50 on the side surface of the sealing portion thereof. In this regard, the conductive members disposed on the side surface of the sealing portion 40 are configured to have a thickness capable of shielding electromagnetic wave flows, thereby securing shielding reliability.

The electronic component module 200 may include a first antenna 60 provided in the first module 70 and a second antenna 26 provided in the second module 80.

The second antenna 26 is configured the same as the antenna (25 of FIG. 2) of the previous examples but in a different location, and thus, a detailed description thereof will be omitted.

The first antenna 60 is disposed either on a second surface of the first board 10 or inside the first board 10 while being adjacent to the second surface of the first board 10.

In an example, the first antenna 60 may be disposed in a region of the first board 10 not opposing the shielding layer 30.

As described herein, the first antenna 60 disposed to face or oppose the shielding layer 30 refers to the first antenna 60 disposed to overlap with the shielding layer 30 when projecting the first antenna 60 and the shielding layer 30 onto a same plane (e.g., the first surface of the first board 10).

When the first antenna 60 is disposed in a region opposing the shielding layer 30, a wireless signal transmitted through the first antenna 60 may be blocked by the shielding wall 50 or the shielding layer 30. Accordingly, in an example, the first antenna 60 is only disposed in the region of the first board 10 not opposing the shielding layer 30 or the shielding wall 50.

Although not limited thereto, the first antenna 60 may also be disposed in a region opposing the shielding layer 30 (or an entire region of the second surface of the first board 10) when the first antenna 60 is configured to only radiate a wireless signal in a direction toward the bottom of the first board 10.

For example, in the case of disposing a dipole antenna radiating a wireless signal in a direction parallel to the first board 10 (e.g., a board surface direction), it is advantageous to dispose the antenna 60 in the region of the first board 10 not opposing the shielding layer 30. In contrast, in the case of a patch antenna radiating a wireless signal in a direction of the bottom of the first board 10 (second surface direction), the antenna 60 may be disposed in the region of the first board opposing the shielding layer 30.

Additionally, in an example, the first antenna 60 is formed using a circuit pattern formed on the first board 10, but is not limited thereto. The antenna 60 is subject to various modifications, for example, an additionally manufactured antenna element may be mounted on the first or second surface of the first board 10.

Figure 12:
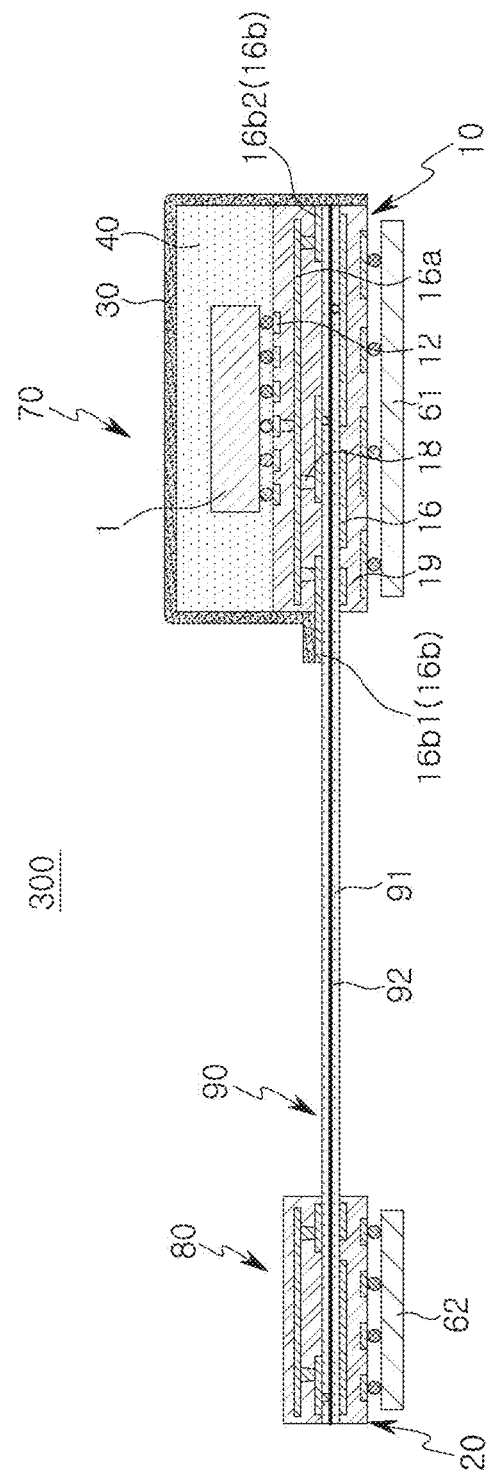
FIG. 12 is a cross-sectional view schematically illustrating an electronic component module according to an example.

FIG. 12 is a cross-sectional view schematically illustrating an electronic component module according to examples and illustrates a cross-section corresponding to I-I' of FIG. 1.

Referring to FIG. 12, an electronic component module 300 may include a first chip antenna 61 mounted on a second surface of a first module 70 and a second chip antenna 62 mounted on a second surface of a second module 80.

The first and second chip antennas 61 and 62 may be prepared in the form of a mounting element, and an emitter may be disposed inside.

Both of the first and second chip antennas 61 and 62 may be configured as a patch antenna, but are not limited thereto. The first and second chip antennas 61 and 62 may be configured as a dipole antenna or as a patch antenna and a dipole antenna, respectively, and the first and second chip antennas 61 and 62 are subject to various modifications as needed.

Further, the first module 70 and the second module 80 include the chip antennas 61 and 62 thereon, but the configuration is not limited thereto. The first module 70 and the second module 80 are subject to various modifications, for example, either one of the first module 70 and the second module 80 may include a chip antenna mounted thereon while the other includes an antenna formed using a wiring layer of the board.

Figure 13:
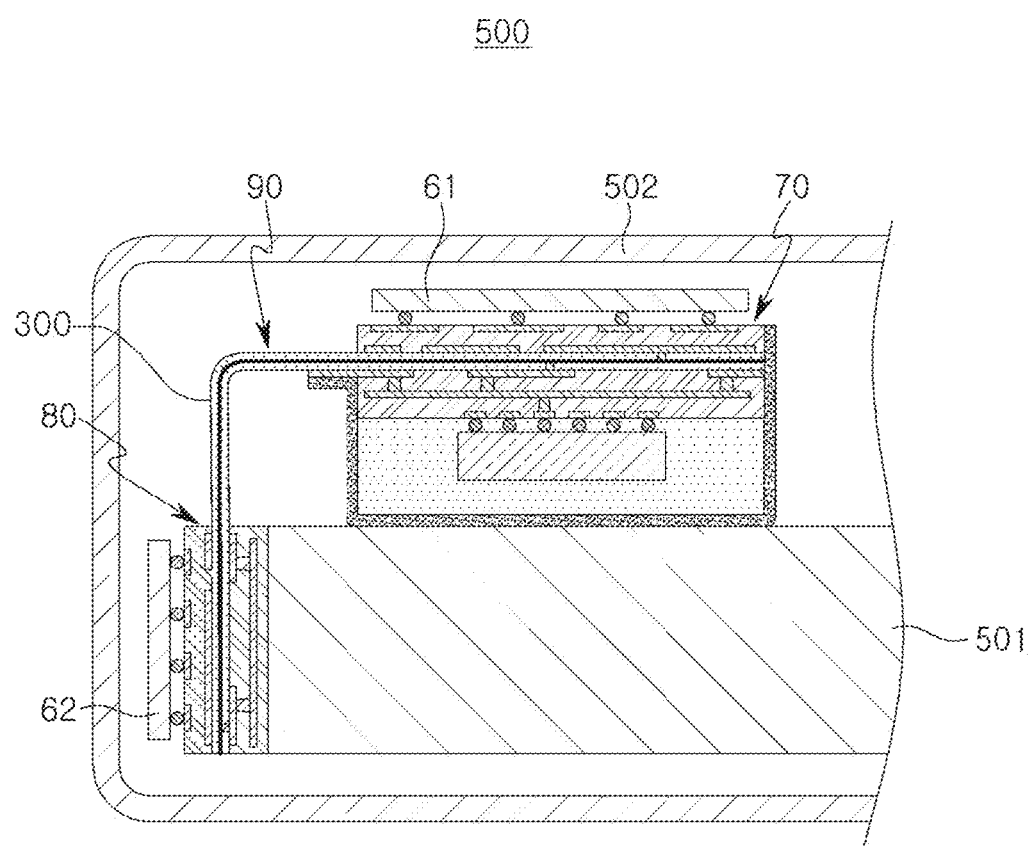
FIG. 13 is a cross-sectional view schematically illustrating an electronic device according to an example.

FIG. 13 is a cross-sectional view schematically illustrating an electronic device according to an example.

Referring to FIG. 13, at least one electronic component module of the previous examples is built in an electronic device 500.

In an example, a case in which the electronic component module 300 illustrated in FIG. 12 is built in the electronic device 500 is exemplified. However, the electronic component module 300 is not limited thereto.

The electronic device 500 may include all devices such as a mobile terminal, in which an antenna is built.

The electronic component module 300 is received in a case 502 of the electronic device 500 and may be fixed to a structure 501 disposed inside the electronic device 500. The structure 501 may include all members disposed inside a case such as a main board, an internal frame, or the like.

The electronic component module 300 may be bonded to the structure 501 via an adhesive tape or through a coupling device additionally prepared such as a bracket.

An electrical connection between the electronic component module 300 and the main board of the electronic device 500 may be achieved by a cable (not illustrated). For example, an end of the cable is bonded to a first element while the other end thereof is bonded to the main board to electrically connect the electronic component module 300 and the main board.

Further, in an example, the first and second chip antennas 61 and 62 of the electronic component module 300 are disposed to face an external side of the structure 501, not the structure 501 side, and are bonded to the structure 501. Accordingly, the electromagnetic waves radiated from the first and second chip antennas 61 and 62 may be radiated toward the outside of the electronic device 500.

In addition, the first and second chip antennas 61 and 62 provided in the first and second modules 70 and 80 may be disposed to have different radiation directions. In an example, the first and second chip antennas 61 and 62 are disposed inside the electronic device 500 so that radiation directions thereof are perpendicular to each other. As electromagnetic waves can be delivered and received in two different directions, wireless signaling efficiency may be increased.

Meanwhile, this examples exemplifies a case in which the first and second chip antennas 61 and 62 are disposed so that the radiation directions thereof are perpendicular to each other. However, the first and second chip antennas 61 and 62 are not limited to such a configuration. As long as the radiation directions are different, the first module 70 and the second module 80 may be disposed in various forms. Similarly, when the electronic component module 200 illustrated in FIG. 9 is built in the electronic device 500, the first and second antennas 60 and 26 of the electronic component module 200 are disposed to face an exterior of the electronic device 500 and to face different directions.

Such a configuration may be applied to the electronic component module 100 illustrated in FIG. 2 in the same manner.

In the electronic component module according to the various examples, a first ground line extending from the first board is disposed on a surface of the connection board but not on the first board. Accordingly, the electronic component module can be connected to a shielding layer in a large contact surface area regardless of a size or a surface area of the first board, thereby improving bonding reliability of the shielding layer.

While examples have been shown and described above, it will be apparent to those skilled in the art that modifications and variations could be made without departing from the scope of the present disclosure as defined by the appended claims.

In the examples, the board was cut after the shielding layer was formed, but various modifications can be employed. For example, the board may be cut first and the shielding layer may then be formed. Additionally, each example can be combined.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component module, comprising:
   a first module comprising a sealing portion disposed on a first surface of a first board and a shielding layer disposed on a surface of the sealing portion;
   a second module spaced apart from the first module; and
   a connection board having greater flexibility than the first board, connecting the first module to the second module, and extending into an internal of the first board,
   wherein at least a portion of the shielding layer is electrically connected to a ground layer of the first board,
   wherein the first module comprises a plurality of electronic components mounted on the first board,
   wherein the plurality of the electronic components comprise a first element disposed outside of the sealing portion and a second element embedded in the sealing portion, and
   wherein the second module comprises at least one antenna electrically connected to the second element.

2. The electronic component module of claim 1, wherein the first module comprises a plurality of electronic components mounted on the first board, and wherein the plurality of the electronic components comprise a first element disposed outside of the sealing portion and a second element embedded in the sealing portion.

3. The electronic component module of claim 1, wherein the first module comprises a second ground line exposed to a side surface of the first board, and the shielding layer is extended toward the side surface of the first board and connected to the second ground line.

4. The electronic component module of claim 1, wherein the ground layer of the first board is disposed in a region of the first board opposing the sealing portion.

5. The electronic component module of claim 1, wherein the first ground line extends inside the first board.

6. The electronic component module of claim 1, wherein the connection board comprises a flexible printed circuit board (PCB).

7. The electronic component module of claim 1, further comprising a shielding wall disposed along a side surface of the sealing portion, wherein the shielding layer is disposed along the shielding wall and the sealing portion.

8. The electronic component module of claim 1, further comprising an antenna disposed on a second surface of the first board or disposed inside the first board and adjacent to the second surface of the first board.

9. The electronic component module of claim 2, wherein the second module comprises at least one antenna electrically connected to the second element.

10. The electronic component module of claim 6, wherein the first board comprises an insulating layer and a wiring layer repeatedly laminated on at least one surface of the connection board.

11. An electronic component module, comprising:
    a first module comprising a sealing portion disposed on a first surface of a first board and a shielding layer disposed along a surface of the sealing portion;
    a second module spaced apart from the first module;
    a connection board having greater flexibility than the first board and connecting the first module to the second module; and
    a first ground line electrically connected to a ground layer of the first board and disposed on a surface of the connection board,
    wherein a first side surface of the sealing portion adjacent to the connection board has roughness different from a roughness of a second side surface opposite the first side surface.

12. The electronic component module of claim 11, wherein a deviation of a surface height of the first side surface is 5 μm or less, and a deviation of a surface height of the second side surface is 1 μm or less.

13. The electronic component module of claim 11, wherein the first module and the second module each comprise an antenna electrically connected to an electronic component mounted on the first board.

14. The electronic component module of claim 11, further comprising a shielding wall disposed along the first side surface and the second side surface of the sealing portion, wherein
    the shielding wall is thinner at a first end adjacent to the first board than at a second end opposite the first end.

15. An electronic device, comprising:
    the electronic component module of claim 11; and
    a case accommodating the electronic component module therein,
    wherein the first module comprises a first antenna and the second module comprises a second antenna,
    wherein the connection board comprises a flexible printed circuit board (PCB) to connect the first module to the second module, and
    wherein the first antenna and the second antenna are disposed such that a first radiation direction of the first antenna is different from a second radiation direction of the second antenna.

16. The electronic component module of claim 12, wherein at least a portion of the shielding layer is electrically connected to the ground layer of the first board.

17. The electronic device of claim 15, wherein the first direction is perpendicular to the second direction.

18. The electronic device of claim 15, wherein the first module comprises a first board having greater rigidity than the connection board, a sealing portion disposed on a first surface of a first board, a shielding layer disposed on a surface of the sealing portion, and at least one electronic component embedded in the sealing portion, and
    the first antenna is disposed on a second surface of the first board opposite the first surface.

19. The electronic device of claim 18, wherein the first module comprises a ground line having a first portion disposed inside the first board and a second portion that extends outside of the first board along a surface of the connection board, and the shielding layer is electrically connected to the second portion of the ground line.

\* \* \* \* \*